(12) United States Patent
Park et al.

(10) Patent No.: US 12,384,619 B2
(45) Date of Patent: Aug. 12, 2025

(54) ARTICLE STORAGE APPARATUS AND METHOD OF CONTROLLING THE SAME

(71) Applicant: SEMES CO., LTD., Cheonan-si (KR)

(72) Inventors: Jun Chul Park, Yongin-si (KR); No Jae Park, Seoul (KR); Seul Lee, Suwon-si (KR); Hyi Jae Kang, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 865 days.

(21) Appl. No.: 17/465,282

(22) Filed: Sep. 2, 2021

(65) Prior Publication Data
US 2022/0063907 A1 Mar. 3, 2022

(30) Foreign Application Priority Data
Sep. 3, 2020 (KR) .................. 10-2020-0112150

(51) Int. Cl.
*B65G 1/04* (2006.01)
*B25J 9/16* (2006.01)
(Continued)

(52) U.S. Cl.
CPC .............. *B65G 1/045* (2013.01); *B25J 9/163* (2013.01); *B25J 13/089* (2013.01); *B65G 1/06* (2013.01); *G06T 7/73* (2017.01); *H01L 21/67259* (2013.01); *H01L 21/67769* (2013.01); *H01L 21/67778* (2013.01); *H01L 21/681* (2013.01); *G05B 2219/35468* (2013.01); *G05B 2219/50391* (2013.01); *G06T 2207/30204* (2013.01)

(58) Field of Classification Search
CPC .. A47F 5/02; B65G 1/045; B65G 1/06; B65G 47/902; B65G 1/1371; B65G 2201/0297; B25J 9/163; B25J 13/089; B25J 9/0081; G06T 7/73; G06T 2207/30204; H01L 21/67259; H01L 21/67769; H01L 21/67778; H01L 21/681; H01L 21/67766; H01L 21/67706; H01L 21/67294; H01L 21/6773; G05B 2219/35468; G05B 2219/50391; B65D 25/02; B65D 25/52; H04N 23/57
See application file for complete search history.

(56) References Cited

U.S. PATENT DOCUMENTS

2019/0193951 A1* 6/2019 Iwasaki .................. B65G 1/137

FOREIGN PATENT DOCUMENTS

| CN | 210709086 | 6/2020 |
| JP | 2003-188228 | 7/2003 |

(Continued)

OTHER PUBLICATIONS

Office Action from the Korean Intellectual Property Office dated Apr. 14, 2023.

*Primary Examiner* — Thomas Randazzo

(57) ABSTRACT

The present disclosure provides an article storage apparatus and a method of controlling the same, which are capable of compensating for a position of a shelf part. The present disclosure may provide an article storage apparatus and a method of controlling the same, which include a method of performing teaching on a shelf in a rotation direction and then performing teaching on a transport robot at the time of performing the teaching on the shelf of the article storage apparatus, thereby implementing high precision and a low teaching failure rate.

17 Claims, 9 Drawing Sheets

(51) Int. Cl.
  *B25J 13/08* (2006.01)
  *B65G 1/06* (2006.01)
  *G06T 7/73* (2017.01)
  *H01L 21/67* (2006.01)
  *H01L 21/677* (2006.01)
  *H01L 21/68* (2006.01)

(56) References Cited

FOREIGN PATENT DOCUMENTS

| | | | | |
|---|---|---|---|---|
| JP | 2019153775 A | * | 9/2019 | ............... B25J 11/00 |
| KR | 101108150 B1 | * | 1/2012 | ....... H01L 21/67265 |
| KR | 10-2012-0090706 | | 8/2012 | |
| KR | 10-2013-0125158 | | 11/2013 | |
| KR | 102239871 B1 | * | 4/2021 | ....... H01L 21/67766 |
| WO | WO-2008011741 A2 | * | 1/2008 | ......... H01L 21/6734 |
| WO | 2015-001907 | | 1/2015 | |

* cited by examiner

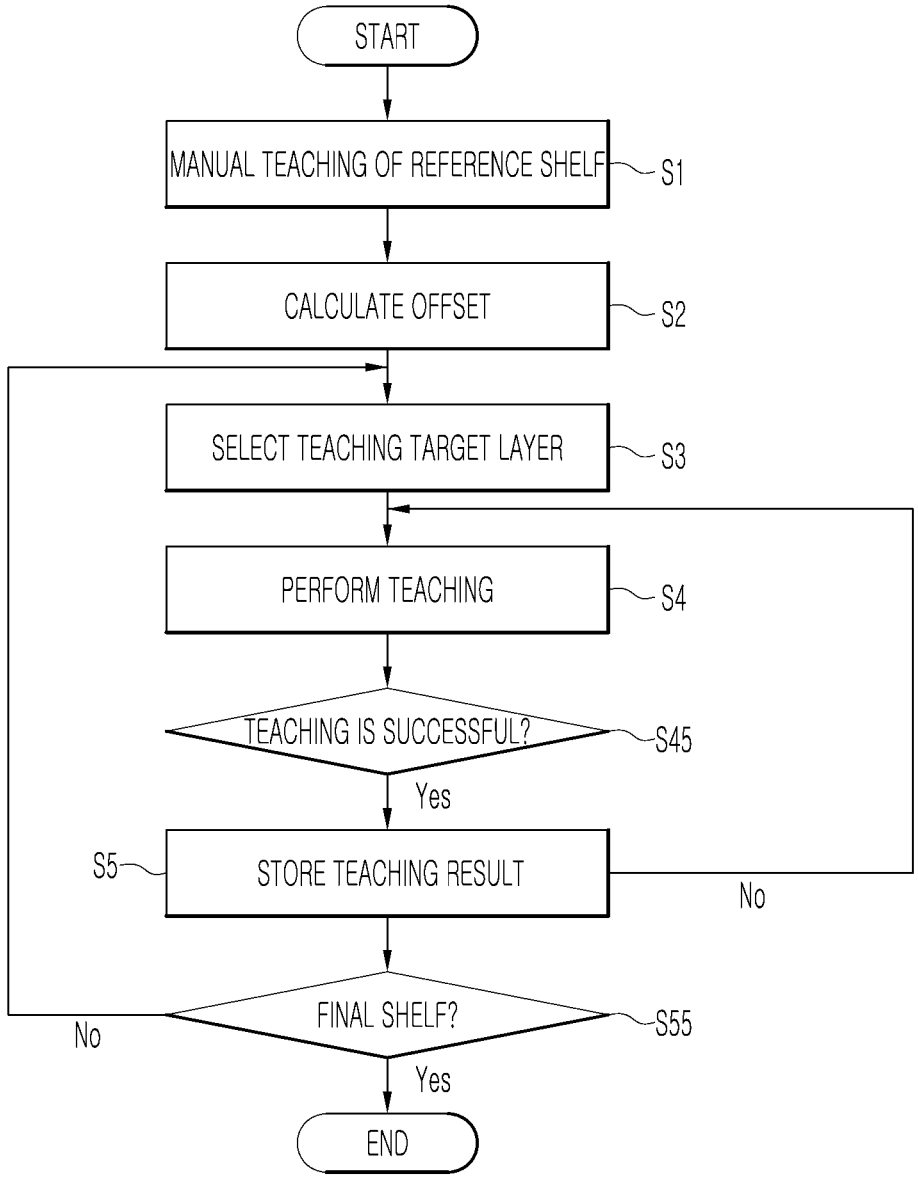

ARTICLE STORAGE APPARATUS AND METHOD OF CONTROLLING THE SAME

CROSS-REFERENCE TO RELATED APPLICATIONS

This application claims the priority of Korean Patent Application No. 10-2020-012150 filed on Sep. 3, 2020, in the Korean Intellectual Property Office, the disclosure of which is incorporated herein by reference.

BACKGROUND

Field

The present disclosure relates to an article storage apparatus and a method of controlling the same, and more particularly, to an automatic teaching system of an article storage apparatus.

Description of the Related Art

In general, facilities configured to perform processes such as deposition, exposure, etching, ion-doping, and cleaning are appropriately disposed in a manufacturing line for manufacturing semiconductors or displays. An article such as a substrate used to manufacture the semiconductor or the display may be stored in an article storage apparatus. The article storage apparatus may have a plurality of shelves for accommodating the articles.

For example, the article may be a cassette for accommodating a wafer or substrate, or the article may be a reticle POD for accommodating a reticle used for an exposure process. The shelves of the article storage apparatus are disposed in multiple layers. The shelf has an approximately cylindrical shape as a whole and may stack the articles around a periphery thereof. The shelf may be a rotary shelf that may be rotatable. A transport robot for transporting the article may be disposed in the article storage apparatus. The transport robot may move in horizontal and vertical directions and have a robot arm for transporting the article.

The transport robot may move in a first horizontal direction and a vertical direction using a first position coordinate preset to accommodate the cassettes in the shelves. Further, the robot arm may move in a second horizontal direction perpendicular to the first horizontal direction using a preset second position coordinate.

The position coordinates may be set in advance using design data for the article storage apparatus. However, a teaching task may be required for the position coordinates because the position coordinates may be different from actual coordinates. However, the article storage apparatus having the rotary shelves is limited in compensating for hardware deviation (e.g., assembly tolerance) only by moving the transport robot. Further, the article storage apparatus has a narrow space at the upper end, making it impossible for an operator to perform the teaching correction.

DOCUMENT OF RELATED ART

Patent Document (Patent Document 1) Korean Patent No. 10-0776254 (Nov. 7, 2007)

SUMMARY

The present disclosure has been made in an effort to provide an article storage apparatus and a method of controlling the same, which are capable of overcoming the limitation in the related art by compensating for a position of a rotary accommodation part.

The present disclosure has also been made in an effort to provide an article storage apparatus and a method of controlling the same, which have high precision and a low teaching failure rate.

The present disclosure has also been made in an effort to provide an article storage apparatus and a method of controlling the same, which may perform precise teaching and do not require teaching correction.

The present disclosure has also been made in an effort to provide an article storage apparatus and a method of controlling the same, which are advantageous in terms of process efficiency.

Technical problems to be solved by the present disclosure are not limited to the above-mentioned technical problems, and other technical problems, which are not mentioned above, may be clearly understood by those skilled in the art from the following descriptions.

An exemplary embodiment of the present disclosure provides an article storage apparatus including: accommodation parts disposed in multiple layers to stack articles around a rotation axis and including a plurality of shelves having teaching marks; a transport robot including a robot arm configured to load the article on the shelf or unload the article from the shelf and configured to support a teaching jig having an image capturing part for acquiring position data by capturing an image of the teaching mark; and a control unit configured to calculate an error value between a position of the shelf and a position of the robot arm based on the position data acquired by the image capturing part, the control unit being configured to perform teaching on the accommodation part or the transport robot based on the error value.

In this case, the control unit may include: a calculation part configured to calculate the error value between the position of the shelf and the position of the robot arm; a determination part configured to select a control method depending on whether the error value calculated by the calculation part exceeds a preset limit value; a teaching part configured to perform the teaching on the transport robot or the shelf by the control method selected by the determination part; and a storage part configured to store the error value calculated by the calculation part and a teaching value performed on the error value by the teaching part.

In addition, the control unit may perform rotational teaching on the shelf or perform vertical teaching and horizontal teaching on the transport robot based on the error value.

Meanwhile, when the error value does not exceed the limit value, the determination part may select a control method that performs the teaching only on the transport robot.

In addition, when the error value exceeds the limit value, the determination part may select a control method that performs the teaching on both the shelf and the transport robot.

The teaching part may perform the teaching on the shelf first by the determination part.

The teaching part may perform the teaching of the transport robot on the shelf on which the teaching is completed.

Meanwhile, the storage part may receive the error value from the calculation part, receive the teaching value, corresponding to the error value, from the teaching part, and store teaching data on the shelf by storing the error value and the teaching value.

In this case, when the error value received from the calculation part is a prestored value, the storage part may apply the teaching value, corresponding to the error value, to the teaching part.

An operation of the determination part for selecting the control method may be omitted by the storage part.

Another exemplary embodiment of the present disclosure provides a method including: a step of performing manual teaching on a reference shelf among the plurality of shelves; a step of calculating an offset value for each layer of the accommodation part; a step of selecting one teaching target layer; a step of performing teaching by applying the corresponding offset values to all the shelves included in the teaching target layer; and a step of performing automatic teaching for storing and managing a teaching value corresponding to each of the shelves by repeating the teaching performing step for all the layers of the accommodation part.

The offset calculation step may include: (1) selecting one teaching target shelf from one layer of the accommodation part; (2) capturing an image of the teaching mark of the teaching target shelf; (3) calculating an error value between a position of the shelf and a position of the transport robot based on position data obtained by capturing the image of the teaching mark of the teaching target shelf; (4) selecting a teaching method on the target shelf based on the error value; (5) performing the teaching on the target shelf with the selected teaching method; and (6) storing the teaching value obtained by performing the teaching.

In this case, the teaching method on the target shelf may include teaching in a rotation direction of the shelf.

In addition, the teaching method on the target shelf may include vertical teaching of the transport robot and horizontal teaching of the transport robot.

Meanwhile, the selecting of the teaching method may select the teaching method based on a result of comparing the error value with a preset limit value.

When the error value does not exceed the preset limit value, the selecting of the teaching method may select a method that performs the teaching only on the transport robot.

When the error value exceeds the preset limit value, the selecting of the teaching method may return the robot arm to the transport robot, perform rotational teaching of the shelf first, and then select a method that performs teaching of the transport robot.

When the teaching on one teaching shelf is completed, the offset calculation step may begin to perform the teaching on one shelf present in the layer different from the teaching shelf.

The offset calculation step may calculate the offset values by performing steps (1) to (6) on all the layers of the accommodation part.

Still another exemplary embodiment of the present disclosure provides a method including: (A) performing manual teaching on a reference shelf among the plurality of shelves; (B) setting one teaching target among the plurality of shelves; (C) capturing an image of the teaching mark of the teaching target shelf; (D) calculating an error value between a position of the teaching target shelf and a position of the transport robot based on position data obtained by capturing the image of the teaching mark; (E) selecting a teaching method on the teaching target shelf based on the error value; (F) performing rotational teaching of the teaching target shelf or movement teaching of the transport robot with the selected teaching method; (G) storing a teaching value related to the performed teaching; (H) setting one shelf, which is present in a layer that does not include the teaching target shelf, as the teaching target shelf when the teaching on one teaching target shelf is completed; (I) calculating an offset value for each layer by repeating steps (C) to (H) until steps (C) to (H) are performed on all the layers; and (J) performing the teaching on all the shelves of the accommodation part by applying the offset value, in which the selecting of the teaching target selects only one shelf for one layer of the accommodation part, and the selecting of the teaching method selects one of a method of only performing the teaching of the transport robot and a method of performing the teaching of the shelf and then performing the teaching of the transport robot.

According to the embodiment of the present disclosure, the teaching in the rotation direction is performed on the shelf first to compensate for the position before the teaching of the transport robot is performed on the teaching target shelf when the teaching is performed on the shelf of the article storage apparatus. Therefore, the teaching, which could not be successful only by the teaching of the transport robot, may be performed and the teaching precision may be improved.

In addition, according to the embodiment of the present disclosure, one teaching target shelf is selected for one layer (floor) of the article storage apparatus with the multiple layers, and the offset value is calculated by repeating the teaching on the target shelf for all the layers. Therefore, it is possible to significantly reduce the time required to perform the teaching by applying, to the remaining shelves, the offset value corresponding to the respective layers.

The effects of the present disclosure are not limited to the above-mentioned effects, and other effects, which are not mentioned above, may be clearly understood by those skilled in the art from the present specification and the accompanying drawings.

BRIEF DESCRIPTION OF THE DRAWINGS

The above and other aspects, features and other advantages of the present disclosure will be more clearly understood from the following detailed description taken in conjunction with the accompanying drawings, in which:

FIG. 9 is a specific flowchart for explaining a process illustrated in FIG. 7.

DETAILED DESCRIPTION OF THE EMBODIMENT

Figure 1:
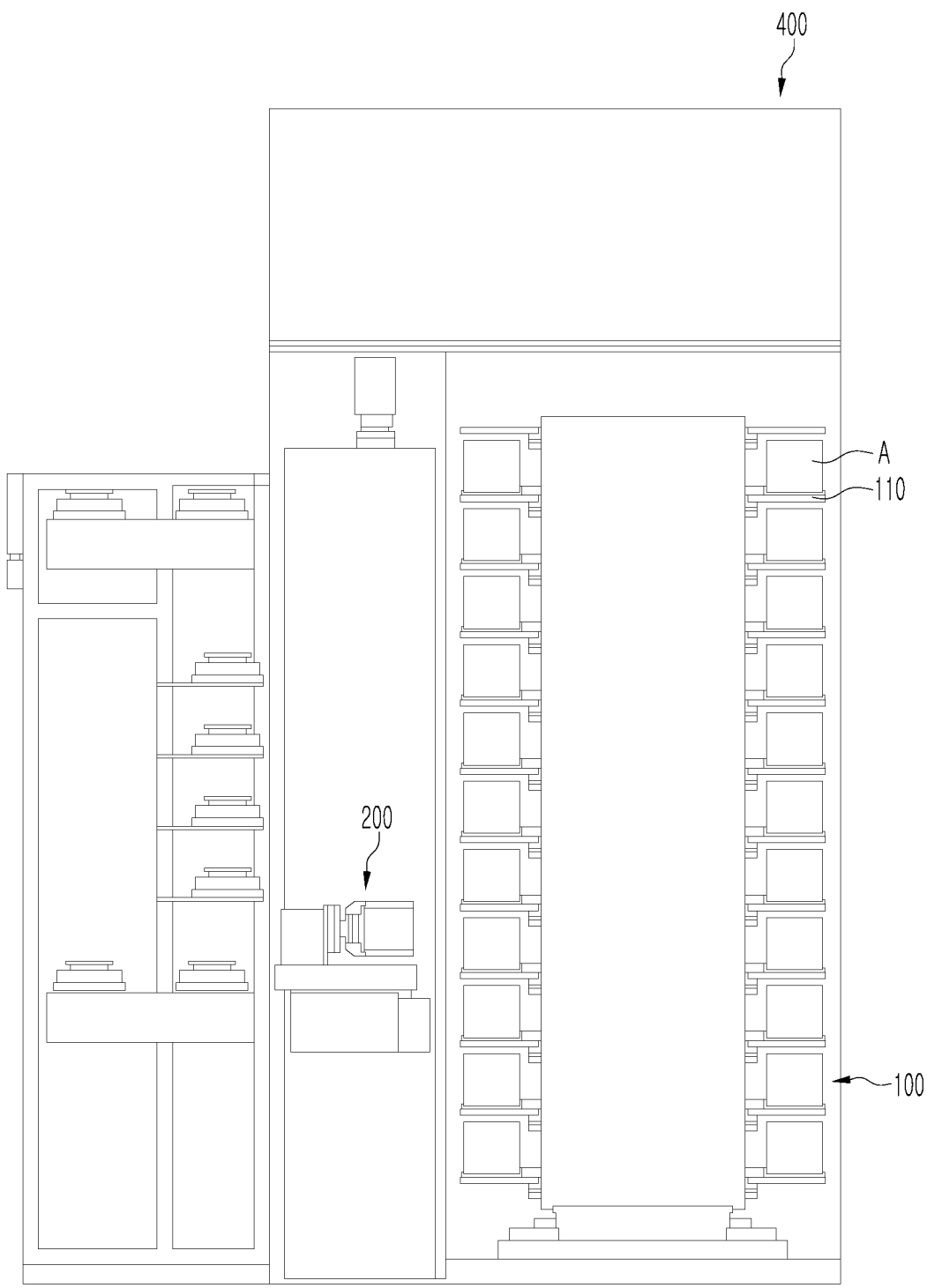
FIG. 1 is a view schematically illustrating an article storage apparatus according to an embodiment of the present disclosure.

Hereinafter, an embodiment of the present disclosure will be described in detail with reference to the accompanying drawings so that those skilled in the technical field to which the present disclosure pertains may easily carry out the embodiment. However, the present disclosure may be implemented in various different ways and is not limited to the embodiments described herein.

In the description of the embodiment of the present disclosure, the specific descriptions of well-known functions or configurations will be omitted when it is determined that the specific descriptions may unnecessarily obscure the subject matter of the present disclosure. Throughout the drawings, the same reference numerals will be used for components that perform similar functions and operations.

At least some of the terms in the present specification are defined in consideration of the functions in the present disclosure and may vary depending on the intention or usual practice of a user or an operator. Therefore, the terms should be interpreted based on the entire contents of the present specification. In addition, throughout the specification, unless explicitly described to the contrary, the word "comprise" or "include" and variations, such as "comprises", "comprising", "includes" or "including", will be understood to imply the inclusion of stated constituent elements, not the exclusion of any other constituent elements. Further, when one constituent element is referred to as being "connected to (or coupled to)" another constituent element, one constituent element can be "directly connected to (coupled to)" the other constituent element, and one constituent element can also be "indirectly connected to (coupled to)" the other element with other elements interposed therebetween.

Meanwhile, in the drawings, sizes and shapes of components, thicknesses of lines, and the like may be somewhat exaggerated for convenience of understanding.

In the description of the embodiment of the present disclosure, 'teaching' means adjusting the position of a teaching target. For example, the teaching target may be a shelf on which articles are loaded or a transport robot that transports articles.

FIGS. 1 to 5 are views schematically illustrating an article storage apparatus according to an embodiment of the present disclosure. Referring to FIGS. 1 to 5, the article storage apparatus 1 includes an accommodation part 100 having a plurality of shelves 110, a transport robot 200, a teaching jig 300, and a control unit 400.

Figure 2:
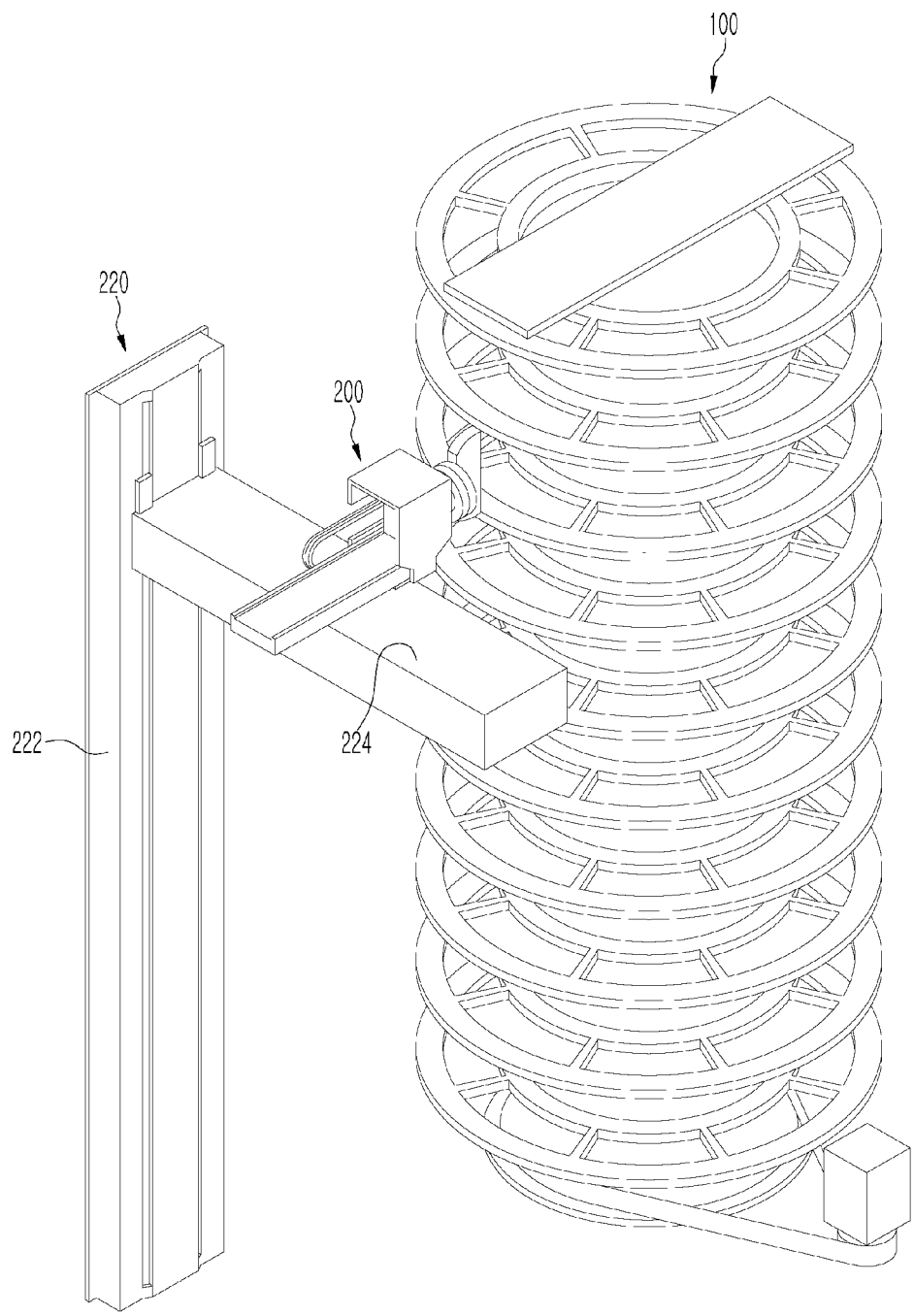
FIG. 2 is a perspective view schematically illustrating a part of the article storage apparatus according to the embodiment of the present disclosure.
Figure 3:
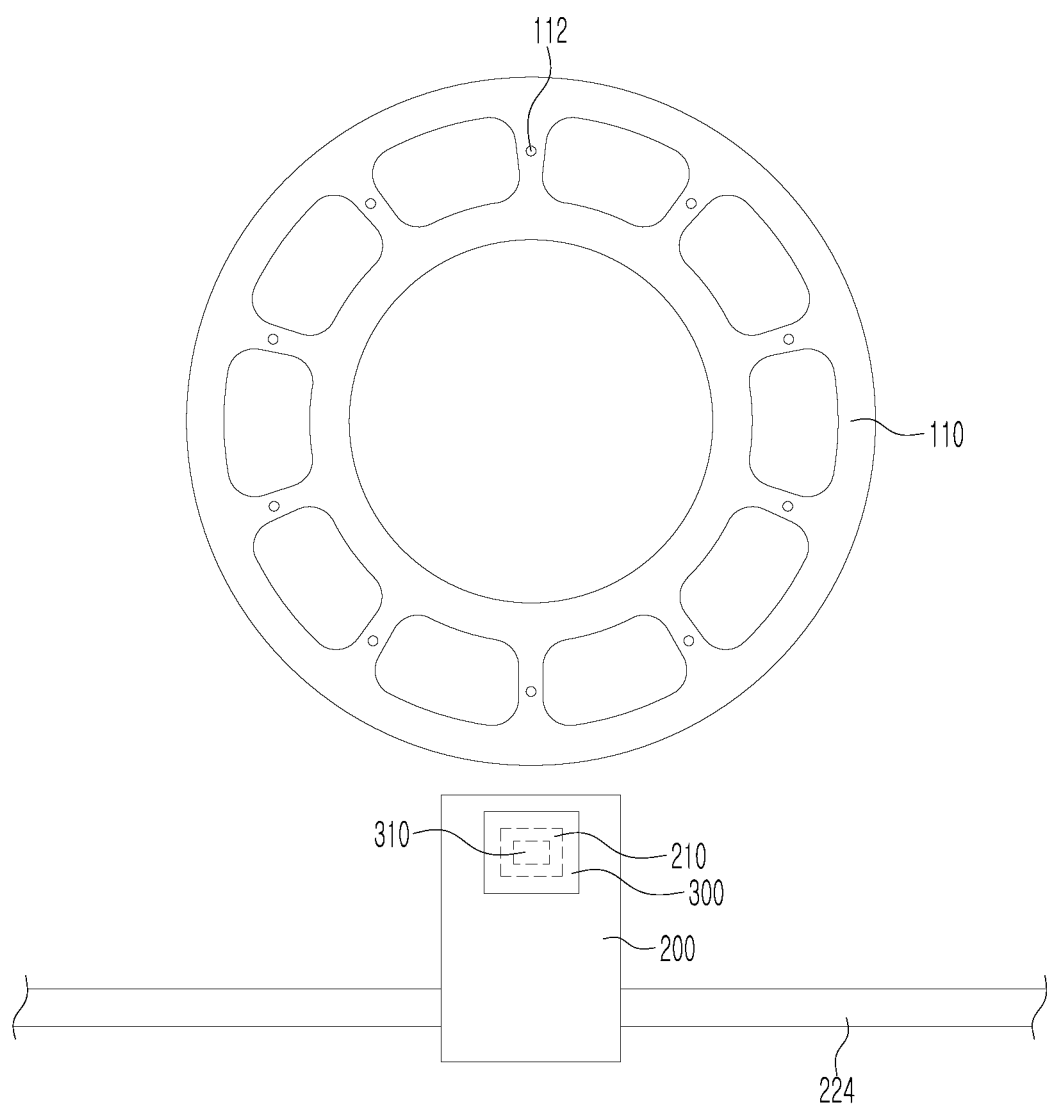
FIGS. 3 and 4 are top plan views schematically illustrating a part of the article storage apparatus according to the embodiment of the present disclosure.
Figure 4:
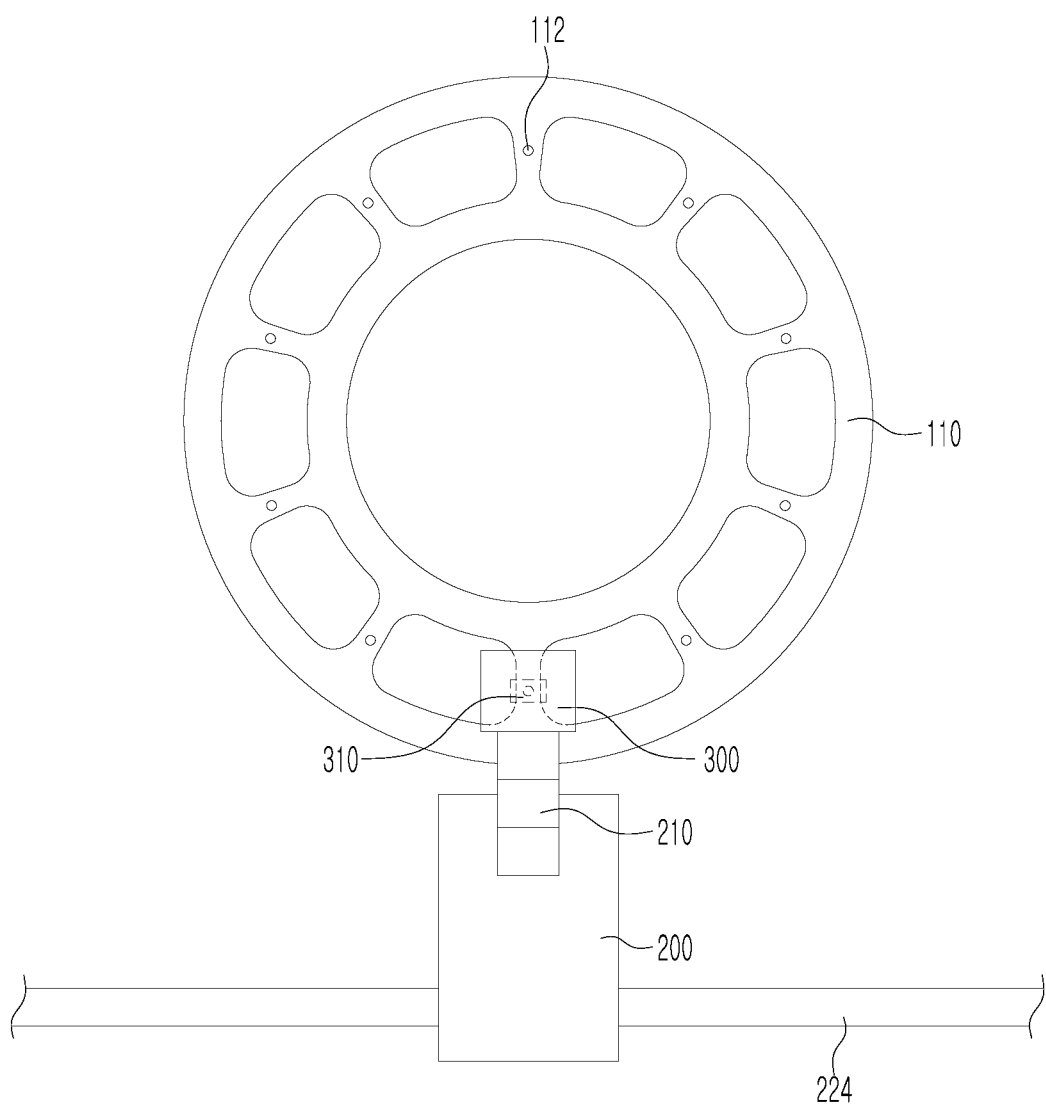
Figure 5:
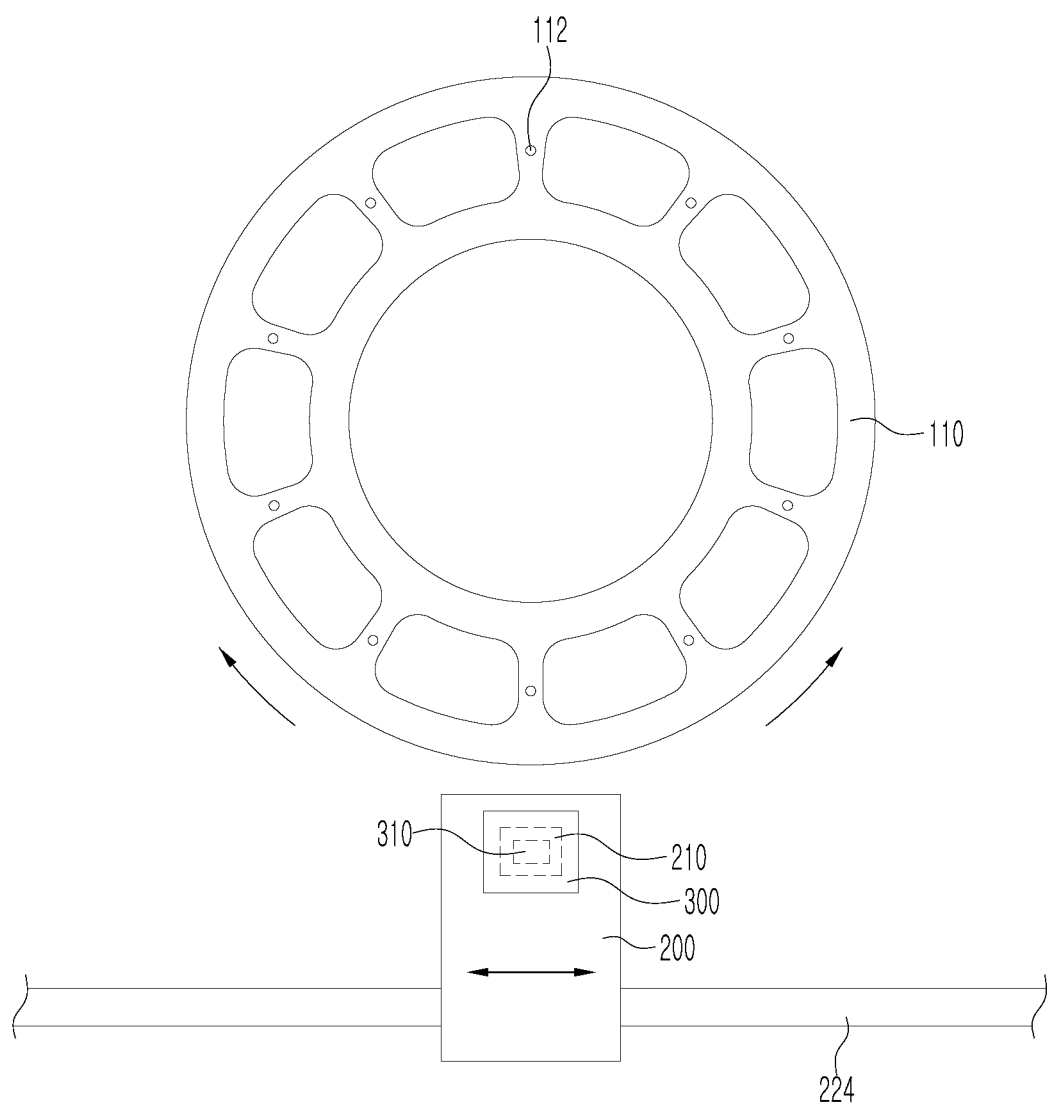
FIG. 5 is a view illustrating operations of an accommodation part and a transport robot illustrated in FIGS. 3 and 4.

The accommodation part 100 includes the plurality of shelves 110 configured to store articles A. As illustrated in FIG. 2, the accommodation part 100 may have multiple layers. The plurality of shelves 110 may each be disposed to have an approximately circular shape to stack the articles A around a rotation axis. In addition, the accommodation part 100 is rotatable about the rotation axis. The respective layers of the accommodation part 100 are individually rotatable. The accommodation part 100 may include a rotation drive part (not illustrated) for rotating the respective layers of the accommodation part 100.

The shelf 110 may be configured to store and accommodate various articles A such as a cassette, a carrier, a FOUP (front opening unified pod), a FOSB (front opening shipping box), a reticle pod, a wafer, a substrate, a glass sheet, and a reticle.

An alignment pin (not illustrated) may be provided on the bottom surface of each of the shelves 110. When the article A is stacked on the shelf 110, the alignment pin of the shelf 110 is inserted into an alignment groove (not illustrated) of the article A, such that the article A may be accurately stacked on each of the shelves 110. In addition, a teaching mark 112 may be provided on an upper surface of each of the shelves 110 and used to recognize a relative position between the shelf 110 and the transport robot 200. The number of teaching marks 112 may be equal to the number of shelves 110 and larger than the number of shelves 110. In the present disclosure, the teaching mark 112 may be one of various positional marks for teaching. For example, the teaching mark 112 may be a QR code, a reflective plate, or the like including positional information. When the teaching mark 112 is a QR code, the QR code may include information on positions of the teaching mark 112.

The transport robot 200 includes a robot arm 210 for loading or unloading the article A. The transport robot 200 travels and moves upward or downward along a transport robot moving unit 220 spaced apart from the accommodation part 100 at a predetermined interval. The transport robot moving unit 220 includes a lifting drive part 222 and a traveling drive part 224. The transport robot moving unit 220 enables the transport robot 200 to approach the shelf at a target position. The transport robot 200, which has approached the target shelf, may load or unload the article by extending the robot arm 210 into the target shelf and retracting the robot arm 210 from the target shelf.

The robot arm 210 may transport the article by supporting a lower surface of the article or holding an upper or lateral portion of the article. The robot arm 210 may move in a direction (forward/rearward direction) perpendicular to a traveling direction of the transport robot 200. In this case, the transport robot 200 may have a separate drive part (not illustrated) for operating the robot arm 210. In addition, the robot arm 210 may be an articulated robot arm that may be extended or retracted.

The transport robot moving unit 220 may include a lifting drive part 222 configured to move the transport robot 200 upward or downward, and a traveling drive part 224 configured to move the transport robot 200 in the horizontal direction. The lifting drive part 222 and the traveling drive part 224 may each be configured using a power transmission device including a motor, a timing belt, and a pulley. Therefore, the transport robot 200 may load the article on the target shelf 110 or unload the article from the shelf 110.

A teaching jig 300 may be provided on a front surface of the robot arm 210 according to the embodiment of the present disclosure, and the teaching jig 300 may include an image capturing part 310 capable of capturing an image of the teaching mark 112 provided on the upper surface of the shelf 110. The teaching jig 300 provides information for teaching the shelf 110 or the transport robot 200. When the robot arm 210 enters the target shelf, the teaching jig 300 may enter the target shelf together with the robot arm 210 capture an image of the teaching mark 112 provided on the upper surface of the shelf 110, thereby acquiring data about the position of the shelf 110. For example, the position data may include coordinate values. In addition, the position data may include data about the size of the teaching mark 112, and the reference values of the size data may be set in advance. Meanwhile, the teaching jig 300 may include a wired or wireless communication part (not illustrated) for transmitting the position data, acquired by the image capturing part 310, to the control unit 400. The image capturing part 310 may be configured as a vision camera, a QR code reader, an optical sensor, or the like depending on a shape of the teaching mark 112. In the present disclosure, for the convenience of description, an example will be described in which the image capturing part 310 is a vision camera.

Figure 6:
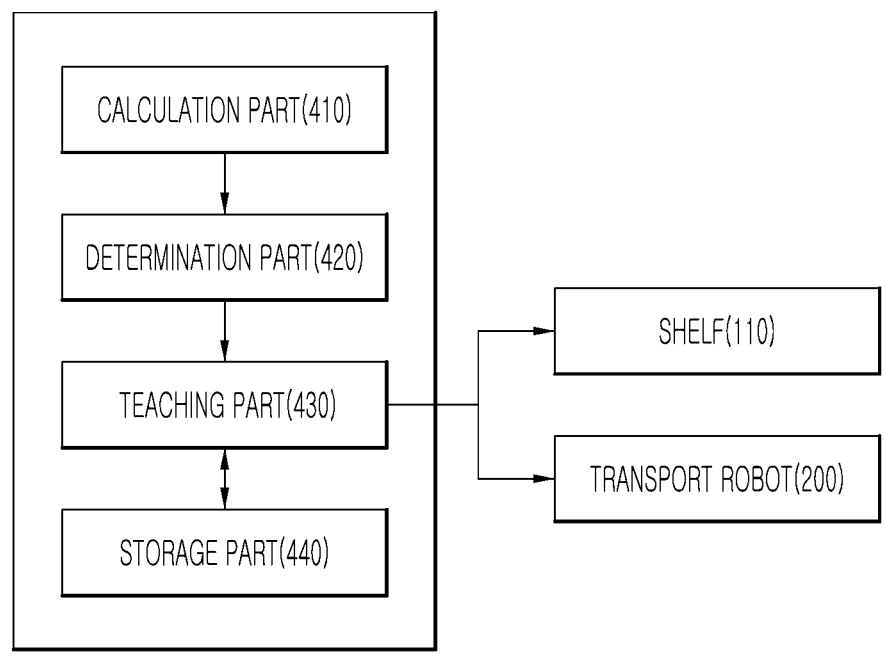
FIG. 6 is a block diagram block illustrating a structure of a control unit according to the embodiment of the present disclosure.

FIG. 6 is a block diagram for schematically explaining a structure of the control unit according to the embodiment of the present disclosure. The control unit 400 may control an overall operation of the article storage apparatus 1 according to the present disclosure. That is, the control unit 400 may control the transport robot 200 to allow the transport robot 200 to receive various types of information and load or unload the article into/from the accommodation part 100.

In addition, the control unit 400 may determine and store the teaching value of the shelf 110 or the transport robot 200.

The control unit 400 may perform the teaching on the shelf 110 or the transport robot 200 based on the position data received from the teaching jig 300. The control unit 400 may include a calculation part 410, a determination part 420, a teaching part 430, and a storage part 440.

The calculation part 410 calculates an error value between the position of the shelf 110 and the position of the robot arm 210 based on the position data received from the teaching jig 300. In this case, the error value is set to 0 when the teaching mark 112 has a size coincident with a reference size and the teaching mark 112 is positioned at a center of the image capturing part 310. That is, the calculation part 410 calculates the deviation of the teaching mark 112 captured by the image capturing part 310 from the center of the image capturing part 310. Based on the error value calculated by the calculation part 410, the control unit 400 may perform the rotational teaching on the shelf 110 or perform the teaching on the transport robot 200 in the vertical direction (upward/downward movement direction) and the horizontal direction (leftward/rightward direction). The error value calculated by the calculation part 410 may be transmitted to the determination part 420 and the storage part 440.

The determination part 420 compares the error value calculated by the calculation part 410 with a preset limit value and selects a control method. For example, when the error value does not exceed the limit value, the determination part 420 may select a control method that performs the teaching only on the transport robot 200. However, when the error value exceeds the limit value, the determination part 420 may select a control method that performs the teaching on both the shelf 110 and the transport robot 200.

The teaching part 430 performs the teaching on the shelf 110 or the transport robot 200 based on the determination (selection) of the determination part 420. First, when the determination part 420 selects the control method that performs the teaching only on the transport robot 200, the teaching part 430 may move the transport robot 200 in the vertical or horizontal direction or move the robot arm 210 in the forward/rearward direction based on the error value, thereby compensating for the error value. When the teaching mark 112 is positioned at the center of the image capturing part 310 by compensating for the error value, the teaching part 430 may transmit, to the storage part 440, the teaching values in the vertical, horizontal, and forward/rearward directions of the transport robot 200.

Meanwhile, when the determination part 420 selects the control method that performs the teaching on both the shelf 110 and the transport robot 200, the teaching part 430 may perform the teaching first on the teaching target shelf 110. The teaching may be performed on the shelf 110 in a state in which the robot arm 210, which has been introduced into the shelf 110, is returned onto the transport robot 200, and the teaching may be performed on the rotation angle of the shelf 110.

When the error value exceeds the limit value, only the teaching on the transport robot 200 cannot compensate for the error value, and a failure of teaching may occur. To prevent this situation, the teaching is performed on the shelf 110 first by rotating the shelf 110 clockwise or counterclockwise by a rotation angle corresponding to the error value. In this case, a teaching range of the shelf 110 may be restricted. The reason is that vibration caused by the teaching on the shelf 110 needs to be minimized and the separation from the transport robot needs to be minimized.

When the teaching on the shelf 110 is completed, the teaching part 230 may perform the teaching on the transport robot 200. Because the method of performing the teaching on the transport robot 200 having the shelf 110 on which the teaching is completed is identical to the method of performing the teaching on the transport robot 200 when the error value does not exceed the limit value, a description thereof will be omitted. When the shelf 110 and the transport robot 200 move to compensate for the error value so that the teaching mark 112 is positioned at the center of the image capturing part 310, the teaching part 430 may transmit, to the storage part 440, the rotational teaching value of the shelf 110 and the teaching values of the vertical, horizontal, and forward/rearward directions of the transport robot 200.

As described above, the teaching is performed on the shelf 110 first to compensate for the position, and then the teaching is performed on the transport robot 200. Therefore, it is possible to solve the problem of the teaching on the transport robot 200 in the related art and improve the teaching precision.

The storage part 440 may receive the error value related to the shelf 110 from the calculation part 410 and receive the teaching value related to the error value from the teaching part 430. The storage part 440 may store the teaching data about the respective shelves 110 based on the received error value and the received teaching value. In addition, if the error value received from the calculation part 410 is a value stored in advance, the storage part 440 may apply, to the teaching part 430, the teaching value corresponding to the error value. That is, an operation of the determination part 420 may be omitted. For example, in response to the error value being the value stored in advance in the storage part 440, the storage part 440 may apply the teaching value to the teaching part 430 without the operation of the determination part 420.

Figure 7:
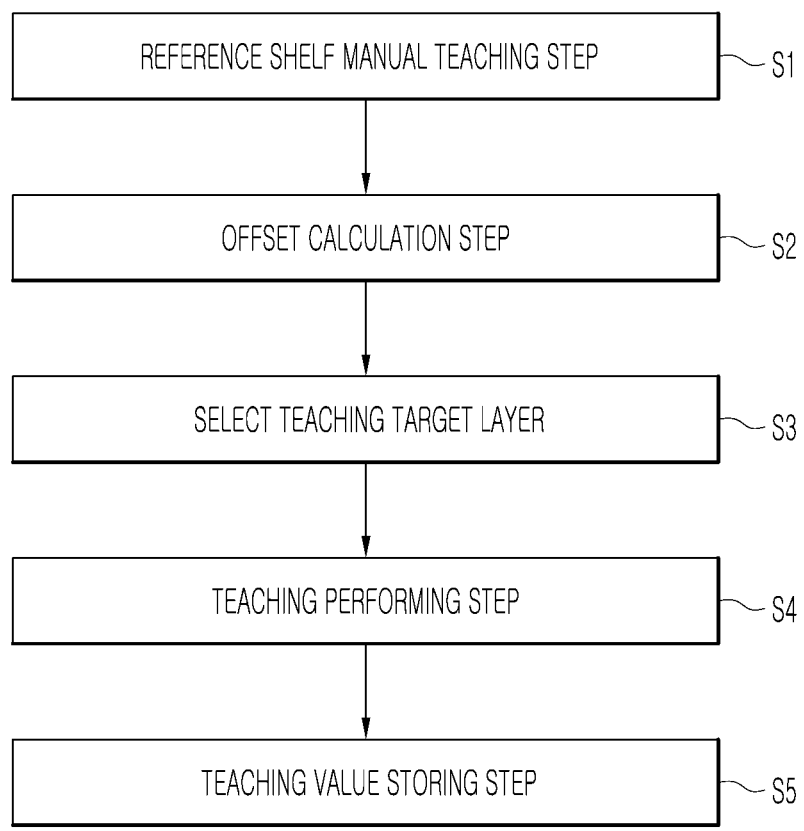
FIG. 7 is a flowchart schematically illustrating a method of controlling the article storage apparatus according to the embodiment of the present disclosure.
Figure 8:
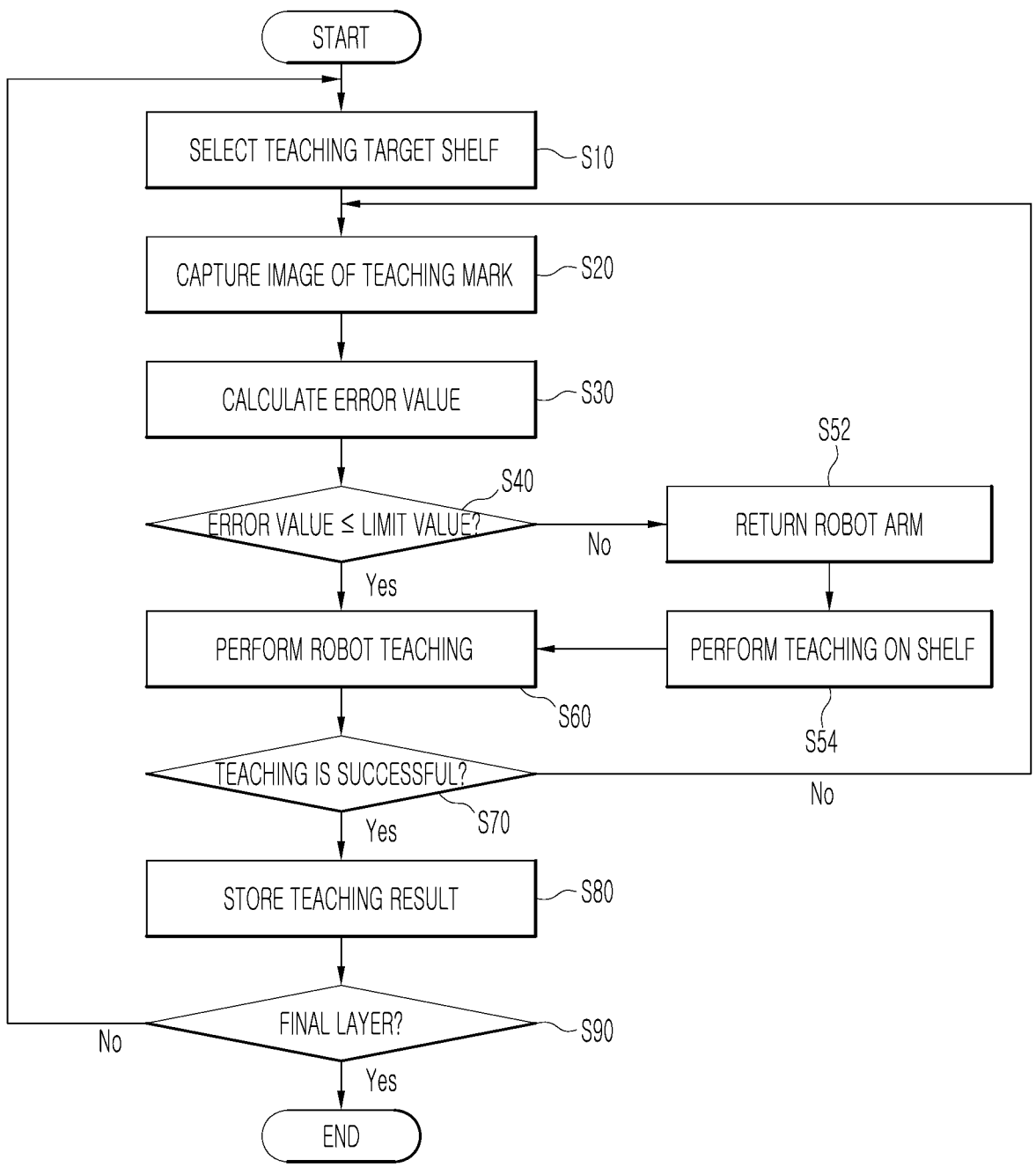
FIG. 8 is a flowchart for explaining an offset calculation step illustrated in FIG. 7.

FIGS. 7 to 9 flowcharts for explaining a method of controlling the article storage apparatus according to the embodiment of the present disclosure.

The method of controlling the article storage apparatus according to the embodiment of the present disclosure includes an automatic teaching system. The method of controlling the article storage apparatus according to the embodiment of the present disclosure will be described with reference to FIGS. 1 to 6.

FIG. 7 is a flowchart schematically illustrating the method of controlling the article storage apparatus according to the embodiment of the present disclosure.

The method of controlling the article storage apparatus according to the embodiment of the present disclosure includes a reference shelf manual teaching step S1, an offset calculation step S2, a target shelf setting step S3, a teaching performing step S4, and a teaching value storing step S5.

In the reference shelf manual teaching step S1, a user determines a reference shelf among the plurality of shelves 110 and directly performs the manual teaching on the reference shelf. In this case, the teaching value obtained by performing the manual teaching is the reference value.

The offset calculation step S2 is a step of selecting one teaching target shelf from all the layers of the article storage apparatus, performing the teaching, storing the teaching value, and calculating offset values for the respective layers.

FIG. 8 is a flowchart for explaining an offset calculation method according to the embodiment of the present disclosure, and FIG. 9 is a view more specifically illustrating the flowchart in FIG. 7 including the offset calculation method illustrated in FIG. 8.

First, one teaching target shelf is selected based on the reference value obtained by performing the manual teaching on the reference shelf (S10). In this case, the teaching target shelf may be determined randomly by the control unit 400 or determined arbitrarily by the user. According to the embodiment of the present disclosure, only one shelf may be selected, as the teaching target shelf, for each layer of the accommodation part 100.

When the teaching target shelf is selected, the transport robot 200 moves to the selected teaching target shelf, and the robot arm 210 enters the shelf. The lifting drive part 222 and the traveling drive part 224 enable the transport robot to approach the teaching target shelf. When the transport robot 200 approaches the teaching target shelf and the robot arm 210 enters the shelf, the robot arm 210 entering the teaching target shelf enables the image capturing part 310 included in the teaching jig 300 to capture an image of the teaching mark disposed on the upper surface of the teaching target shelf (S20). The image capturing part 310 may obtain the position data by capturing the image of the teaching mark of the teaching target shelf and transmit the position data to the control unit 400. In this case, the position data may include the size data of the teaching mark, and the reference value of the size data may be set in advance.

The position data transmitted from the teaching jig 300 may be transmitted to the calculation part 410 and converted into the error value by the calculation part 410 (S30). In this case, the error value may be set to 0 when the teaching mark is coincident with the reference size and the teaching mark is positioned at the center of the image capturing part 310.

The teaching of the transport robot 200 or the shelf 110 may be performed on the teaching target shelf based on the error value calculated by the calculation part 410. The error value calculated by the calculation part 410 may be transmitted to the determination part 420 and compared with the preset limit value. Based on the comparison result, the determination part 420 may select the control method (S40).

For example, when the error value exceeds the limit value, the determination part 420 may select the method that performs the teaching on both the shelf 110 and the transport robot 200. In this case, the control unit 400 returns the robot arm 210, which has entered the shelf, to the transport robot 200 (S52) and then performs the teaching on the shelf first (S54). The teaching on the shelf rotates the shelf 110 clockwise or counterclockwise by the rotation angle corresponding to the error value. The teaching may be performed on the shelf 110 by the teaching part 430. The teaching part 430 completely performs the teaching on the shelf 110 based on the error value and then performs the teaching on the transport robot 200 (S60). The teaching of the transport robot 200 may include vertical teaching and horizontal teaching of the transport robot and further include forward/rearward teaching of the robot arm 210. As described above, since the teaching is performed on the shelf 110 before the teaching is performed on the transport robot 200, it is possible to prevent a situation in which only the teaching of the transport robot 200 cannot compensate for the error value.

Meanwhile, when the error value does not exceed the limit value, the determination part 420 may select the method that performs the teaching only on the transport robot 200. In this case, the teaching part 430 may perform the teaching on the transport robot 200 based on the error value (S60).

When the teaching is completed, a teaching result check may be performed (S70). When the teaching is successful, the teaching value of the shelf 110 or the transport robot 200 is stored in the storage part 440 (S80). However, when the teaching is not successful, the process goes to the step S20 of capturing an image of the teaching mark and the subsequent steps are performed again. The steps from the step S20 of capturing the image of the teaching mark to the step S70 of checking teaching success are repeated until the teaching is successful. The teaching result checking may use the method using the image capturing part 310 included in the teaching jig 300 or use a separate sensor for checking the teaching result.

When the teaching is successful and the teaching value is stored in the storage part 440, the process goes to the step S10 of setting the teaching target shelf, and the subsequent steps are repeated until one teaching target shelf is included in all the layers of the accommodation part 100.

When the teaching is completely performed on the respective teaching target shelves for all the layers of the accommodation part 100, the offset value for the respective layers may be calculated based on the stored teaching value.

Thereafter, a step S3 of selecting the layer on which the teaching is performed based on the calculated offset value, a step S4 of performing the teaching on all the shelves included in the selected layer by applying the offset value related to the selected layer, a step S45 of checking a teaching result, and a step S5 of storing the teaching result are performed for all the layers, and the automatic teaching is ended.

As described above, the offset value is calculated for the respective layers of the article storage apparatus 1, and then the automatic teaching is performed on all the shelves 110, such that unnecessary teaching is prevented from being performed again, thereby reducing the time required to perform the teaching. For example, the teaching is required to be performed again only on the offset reference shelf when the offset is applied, whereas the teaching is required to be performed again on all the shelves in the layer including the teaching failure shelf when the offset is not applied.

Meanwhile, the method of controlling the article storage apparatus according to the embodiment of the present disclosure includes the teaching in the rotation direction on the shelf as well as the transport robot. Therefore, it is possible to overcome the limitation in the related art and reduce a teaching failure rate by increasing precision. The precise teaching makes it unnecessary to perform the teaching correction. In addition, according to the present disclosure, the offset value for the respective layers may be calculated, and the automatic teaching may be performed on the transport robot and the shelf, such that the automatic teaching using the offset value may reduce the time required to perform the teaching. Therefore, the automatic teaching is also advantageous in terms of process efficiency.

While the present disclosure has been described above, the present disclosure is not limited to the disclosed embodiments and the accompanying drawings, and those skilled in the art may variously modify the present disclosure without departing from the technical spirit of the present disclosure. In addition, the technical features described in the embodiments of the present disclosure may be independently carried out or two or more technical features may be combined.

What is claimed is:

1. An article storage apparatus comprising:
   an accommodation part comprising a plurality of shelves having teaching marks, the plurality of shelves being stacked on each other along a rotation axis of the accommodation part, wherein each of the plurality of shelves receives an article from a robot arm;

a transport robot comprising the robot arm configured to load the article on a target shelf among the plurality of shelves and configured to support a teaching jig having an image capturing part for acquiring position data by capturing an image of a teaching mark of the target shelf, wherein the teaching mark is disposed at an upper surface of the target shelf; and a control unit configured to calculate an error value between a position of the target shelf and a position of the robot arm based on the position data acquired by the image capturing part, the control unit being configured to perform teaching on the accommodation part or the transport robot based on the error value, wherein the control unit comprises:

a calculation part configured to calculate the error value between the position of the target shelf and the position of the robot arm; and a determination part configured to:

select, in response to the error value not exceeding a preset limit value, a first control method that performs the teaching only on the transport robot.

2. The article storage apparatus of claim 1,
wherein the control unit performs rotational teaching on the target shelf or performs vertical teaching and horizontal teaching on the transport robot based on the error value.

3. The article storage apparatus of claim 1,
wherein the control unit further comprises:
a teaching part configured to perform the teaching on the transport robot by the first control method selected by the determination part; and
a storage part configured to store the error value calculated by the calculation part and a teaching value performed on the error value by the teaching part.

4. The article storage apparatus of claim 3,
wherein the determination part is configured further to select, in response to the error value exceeding the preset limit value, a second control method that performs the teaching on both the target shelf and the transport robot.

5. The article storage apparatus of claim 4,
wherein when the determination part selects the second control method that performs the teaching on both the target shelf and the transport robot, the teaching part performs the teaching on the target shelf first.

6. The article storage apparatus of claim 5,
wherein the teaching part performs the teaching of the transport robot on the target shelf on which the teaching is completed.

7. The article storage apparatus of claim 3,
wherein the storage part is configured to:
receive the error value from the calculation part;
receive the teaching value, corresponding to the error value, from the teaching part; and
store teaching data on the target shelf by storing the error value and the teaching value.

8. The article storage apparatus of claim 7,
wherein the storage part is configured to apply, in response to the error value received from the calculation part being a prestored value, the teaching value, corresponding to the error value, to the teaching part.

9. The article storage apparatus of claim 8,
wherein the storage part is configured to apply the teaching value to the teaching part without an operation of the determination part for selecting the first control method.

10. A method of controlling an article storage apparatus, wherein the article storage apparatus includes: an accommodation parts disposed in multiple layers to stack articles around a rotation axis and comprising a plurality of shelves having teaching marks; and a transport robot comprising a robot arm configured to load an article on a shelf among the plurality of shelves or unload the article from the shelf and configured to support a teaching jig having an image capturing part for acquiring position data by capturing an image of a teaching mark of the shelf, the method comprising:

a step of performing manual teaching on a reference shelf among the plurality of shelves;

a step of calculating an offset value for each layer of the accommodation part;

a step of selecting a teaching target layer of the multiple layers;

a step of performing teaching by applying a corresponding offset values to all shelves included in the teaching target layer; and a step of performing automatic teaching for storing and managing a teaching value corresponding to each of the plurality of shelves by repeating the step of performing the teaching for all the multiple layers of the accommodation part, wherein the step of the calculating the offset value comprises:

(1) selecting a target shelf from one layer of the accommodation part;

(2) capturing an image of the teaching mark of the target shelf;

(3) calculating an error value between a position of the shelf and a position of the transport robot based on the position data obtained by capturing the image of the teaching mark of the target shelf; and (4) selecting a teaching method on the target shelf based on the error value, wherein, when the error value does not exceed a preset limit value, the step of the selecting of the teaching method includes selecting a first control method that performs the teaching only on the transport robot.

11. The method of claim 10,
wherein, when the error value exceeds the preset limit value, the selecting of the teaching method includes selecting a second control method that performs rotational teaching of the shelf first, and then performs teaching of the transport robot.

12. The method of claim 10,
wherein the step of the calculating the offset value further comprises:
(5) performing the teaching on the target shelf with the selected teaching method; and
(6) storing the teaching value obtained by performing the teaching.

13. The method of claim 12,
wherein the teaching method on the target shelf comprises teaching in a rotation direction of the shelf.

14. The method of claim 12,
wherein the teaching method on the target shelf comprises vertical teaching of the transport robot and horizontal teaching of the transport robot.

15. The method of claim 12,
wherein when the teaching on one teaching shelf is completed, the step of calculating the offset value begins to perform the teaching on one shelf present in the layer different from the teaching shelf.

16. The method of claim 12, wherein the step of the calculating the offset value includes calculating the offset values by performing steps (1) to (6) on all the layers of the accommodation part.

17. A method of controlling an article storage apparatus, wherein the article storage apparatus includes: an accommodation parts disposed in multiple layers to stack articles around a rotation axis and comprising a plurality of shelves having teaching marks; and a transport robot comprising a robot arm configured to load an article on a target shelf among the plurality of shelves or unload the article from the target shelf and configured to support a teaching jig having an image capturing part for acquiring position data by capturing an image of a teaching mark of the target shelf, the method comprising:
   (A) performing manual teaching on a reference shelf among the plurality of shelves;
   (B) setting the target shelf among the plurality of shelves;
   (C) capturing the image of the teaching mark of the target shelf;
   (D) calculating an error value between a position of the target shelf and a position of the transport robot based on position data obtained by capturing the image of the teaching mark;
   (E) selecting a teaching method on the target shelf based on the error value;
   (F) performing rotational teaching of the target shelf or movement teaching of the transport robot with the selected teaching method;
   (G) storing a teaching value related to the performed teaching;
   (H) setting one shelf, which is present in a layer that does not include the target shelf, as another target shelf when the teaching on the target shelf is completed;
   (I) calculating an offset value for each layer by repeating steps (C) to (H) until steps (C) to (H) are performed on all the layers; and
   (J) performing the teaching on all the shelves of the accommodation part by applying the offset value,
   wherein the selecting of the target shelf selects only one shelf for one layer of the accommodation part,
   wherein, when the error value does not exceed a preset limit value, the selecting of the teaching method includes selecting a first control method that performs the teaching only on the transport robot, and
   wherein, when the error value exceeds the preset limit value, the selecting of the teaching method includes selecting a second control method that performs the rotational teaching of the target shelf first, and then performs teaching of the transport robot.

* * * * *